United States Patent
Kawai et al.

(10) Patent No.: US 12,027,398 B2
(45) Date of Patent: Jul. 2, 2024

(54) EFEM

(71) Applicant: Sinfonia Technology Co., Ltd., Tokyo (JP)

(72) Inventors: Toshihiro Kawai, Tokyo (JP); Gengoro Ogura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 887 days.

(21) Appl. No.: 16/980,764

(22) PCT Filed: Mar. 13, 2019

(86) PCT No.: PCT/JP2019/010350
§ 371 (c)(1),
(2) Date: Sep. 14, 2020

(87) PCT Pub. No.: WO2019/177046
PCT Pub. Date: Sep. 19, 2019

(65) Prior Publication Data
US 2021/0013078 A1    Jan. 14, 2021

(30) Foreign Application Priority Data
Mar. 15, 2018   (JP) ................................ 2018-048429

(51) Int. Cl.
| H01L 21/673 | (2006.01) |
| H01L 21/67  | (2006.01) |
| H01L 21/677 | (2006.01) |

(52) U.S. Cl.
CPC .. H01L 21/67393 (2013.01); H01L 21/67253 (2013.01); H01L 21/6773 (2013.01)

(58) Field of Classification Search
CPC ......... H01L 21/67363; H01L 21/67253; H01L 21/6773; H01L 21/67017; H01L 21/67766; H01L 21/67763
See application file for complete search history.

(56) References Cited

U.S. PATENT DOCUMENTS

| 5,788,448 A     | 8/1998 | Wakamori et al. |
| 6,176,023 B1 *  | 1/2001 | Doche ............... H01L 21/67775 |
|                 |        | 34/107 |

(Continued)

FOREIGN PATENT DOCUMENTS

| JP | H08-213446 A   | 8/1996 |
| JP | 2014-112631 A  | 6/2014 |
| JP | 2017-005283 A  | 1/2017 |

OTHER PUBLICATIONS

Japan Patent Application No. PCT/JP2019/010350, International Search Report (and translation) and Written Opinion, dated May 21, 2019.

*Primary Examiner* — Patrick C Williams
(74) *Attorney, Agent, or Firm* — Kilpatrick Townsend & Stockton LLP

(57) ABSTRACT

In the present disclosure, when a supply flow rate of an inert gas is changed, a pressure fluctuation in a circulation path is suppressed. An EFEM includes a supply valve configured to be capable of changing a supply flow rate of the inert gas supplied to the circulation path, a discharge valve configured to be capable of changing a discharge flow rate of a gas discharged from the circulation path, a concentration detection part configured to detect a change in an atmosphere inside the circulation path, a pressure detection part configured to detect a pressure in the circulation path, and a control part configured to control the supply valve and the discharge valve. The control part is configured to determine an opening degree of the discharge valve to a predetermined value based on a detection result obtained by the concentration detection part.

9 Claims, 10 Drawing Sheets

(56) References Cited

U.S. PATENT DOCUMENTS

| | | | | |
|---|---|---|---|---|
| 6,287,984 B1* | 9/2001 | Horie | ............... | H01L 21/67017 |
| | | | | 118/724 |
| 2018/0286705 A1* | 10/2018 | Barros | .............. | H01L 21/67017 |

* cited by examiner

Time-dependent change of pressure in circulation path

Time-dependent change of opening degree of discharge valve

FIG. 7

Correspondence table of oxygen concentration, nitrogen supply flow rate and opening degree of discharge valve

| Oxygen concentration [ppm] | Nitrogen supply flow rate [LPM] | Opening degree of Discharge valve [%] |
|---|---|---|
| 200 or more | 400 | 90 |
| 100~199 | 300 | 70 |
| 70~99 | 200 | 50 |
| 30~69 | 100 | 30 |
| 29 or less | 50 | 15 |

Time-dependent change of oxygen concentration

Time-dependent change of nitrogen supply flow rate

Time-dependent change of opening degree of discharge valve

Time-dependent change of opening degree of discharge valve in conventional method

EFEM

CROSS-REFERENCE TO RELATED APPLICATIONS

This application is a national phase entry under 35 USC § 371 of International Application PCT/JP2019/010350 ("the '350 application"), filed Mar. 13, 2019, which application claims priority to and benefits of Japan Patent Application No. 2018-048429 ("the '429 application"), filed on Mar. 15, 2018. The '350 application and the '429 applications are hereby incorporated in their entireties by this reference.

TECHNICAL FIELD

The present disclosure relates to an EFEM (Equipment Front End Module) capable of circulating an inert gas.

BACKGROUND

Patent Document 1 discloses an EFEM configured to deliver a wafer between a processing apparatus that performs a predetermined process on a semiconductor substrate (wafer) and a pod that stores the wafer. The EFEM includes a housing in which a delivery zone (transfer chamber) for transferring a wafer is formed.

Conventionally, an influence of oxygen, moisture and the like in a transfer chamber on a semiconductor circuit manufactured on a wafer has been small, but in recent years, such influence has become apparent as a semiconductor circuit is further miniaturized. Therefore, the EFEM described in Patent Document 1 is configured such that an inside of the transfer chamber is filled with nitrogen which is an inert gas. Specifically, the EFEM includes a circulation path configured to circulate nitrogen inside a housing and provided with a transfer chamber, a flow rate controller configured to adjust a supply flow rate of nitrogen supplied from a supply source to the circulation path, and a release valve configured to discharge a gas from the circulation path. Thus, by adjusting a nitrogen supply flow rate and a gas discharge flow rate as needed while circulating the nitrogen, it is possible to keep an inside of the circulation path in a nitrogen atmosphere while suppressing an increase in the nitrogen supply flow rate.

Furthermore, the EFEM includes an oxygen concentration meter configured to measure an oxygen concentration in the circulation path, a pressure gauge configured to measure a pressure in the circulation path, and a control part. When the oxygen concentration in the circulation path exceeds a predetermined value, the control part controls a flow path controller to increase the nitrogen supply flow rate and reduce the oxygen concentration in the circulation path.

PRIOR ART DOCUMENT

Patent Document

Patent Document 1: Japanese Patent Application publication No. 2017-5283

In a type of an EFEM that circulates nitrogen, the pressure inside the circulation path needs to be kept slightly higher than an external pressure (at a pressure of, for example, 3 to 500 Pa (G), preferably 5 to 100 Pa (G)) in order to reliably suppress invasion of an ambient air from the outside into the circulation path while suppressing leakage of nitrogen from the circulation path to the outside. Therefore, when the pressure in the circulation path is out of a predetermined range, the control part changes a nitrogen discharge flow rate by changing an opening degree of the release valve, and adjusts the pressure to a predetermined target pressure. Thus, the nitrogen supply flow rate is adjusted based on the oxygen concentration and the nitrogen discharge flow rate is adjusted based on the pressure, whereby the oxygen concentration and the pressure are controlled.

In a case where the oxygen concentration in the circulation path increases for a certain reason, it is necessary to quickly reduce the oxygen concentration by supplying nitrogen in order to suppress the influence of oxygen on the wafer, and therefore the nitrogen supply flow rate temporarily increases. In the EFEM described in Patent Document 1, for example, when a capacity of the circulation path is large, it may take time until a pressure change in the circulation path is detected by the pressure gauge after the nitrogen supply flow rate is changed. For this reason, there is a risk that the timing of a discharge flow rate change with respect to a supply flow rate change is delayed (that is, a timing of pressure control is delayed), whereby a fluctuation in the pressure in the circulation path increases. Thus, there may be a problem that the pressure in the circulation path becomes too higher than a pressure in the external space, whereby the nitrogen easily leaks from the circulation path to the external space, or a problem that the pressure in the circulation path becomes too lower than the pressure in the external space, whereby the ambient air easily flows into the circulation path from the external space.

The present disclosure intends to suppress a pressure fluctuation in a circulation path when a supply flow rate of an inert gas is changed

SUMMARY

An EFEM according to a first aspect of the present disclosure is an EFEM where a circulation path for circulating an inert gas is formed, the EFEM including: a supply valve configured to be capable of changing a supply flow rate of the inert gas supplied to the circulation path; a discharge valve configured to be capable of changing a discharge flow rate of a gas discharged from the circulation path; a concentration detection part configured to detect a change in an atmosphere inside the circulation path; a pressure detection part configured to detect a pressure in the circulation path; and a control part configured to control the supply valve and the discharge valve, wherein the control part is configured to determine an opening degree of the discharge valve to a predetermined value based on a detection result of the concentration detection part.

According to this aspect, the opening degree of the discharge valve is determined to a predetermined value according to the change of the atmosphere. Thus, the opening degree of the discharge valve can be changed together with a change in an opening degree of the supply valve. That is, by increasing the discharge flow rate in conformity with a timing of increasing the supply flow rate and decreasing the discharge flow rate in conformity with a timing of decreasing the supply flow rate, it is possible to reduce the pressure fluctuation in the circulation path as compared with the case of changing the discharge flow rate after waiting for the pressure change in the circulation path. Accordingly, it is possible to suppress the pressure fluctuation in the circulation path when the supply flow rate of the inert gas is changed.

An EFEM according to a second aspect of the present disclosure is an EFEM where, in the first aspect, the control part may switch a control mode between a feed-back mode in which the opening degree of the discharge valve is feed-back-controlled based on a detection result of the pressure detection part so that the pressure in the circulation path is maintained at a target pressure and a feed-forward mode in which the opening degree of the discharge valve is determined based on the detection result of the concentration detection part, and when an opening degree of the supply valve is changed based on the detection result of the concentration detection part, the control mode may be switched from the feed-back mode to the feed-forward mode.

According to this aspect, by appropriately switching the control mode between the feed-back mode and the feed-forward mode, it is possible to reliably and stably control the pressure in the circulation path during a normal time, and to effectively suppress the pressure fluctuation in the circulation path when the supply flow rate of the inert gas is changed.

An EFEM according to a third aspect of the present disclosure is an EFEM where, in the second aspect, the control part returns the control mode from the feed-forward mode to the feed-back mode when a predetermined time elapses after the control mode is switched from the feed-back mode to the feed-forward mode.

According to this aspect, when a predetermined time elapses after the control mode has been switched to the feed-forward mode, and a gas flow rate of each part constituting the circulation path is stabilized to some extent (a pressure distribution in the circulation path is made uniform to some extent), the control mode is returned to the feed-back mode. Accordingly, it is possible to stabilize the feed-back control of the pressure after the supply flow rate of the inert gas is changed.

An EFEM according to a fourth aspect of the present disclosure is an EFEM where, in the second aspect or the third aspect, the control part includes a memory part that stores a table which is divided into a plurality of sections according to the change in the atmosphere and in which the opening degree of the supply valve and the opening degree of the discharge valve are associated with each other for each of the sections.

For example, when a function in which the oxygen concentration is associated with the opening degree of the supply valve or a function in which the oxygen concentration is associated with the opening degree of the discharge valve is used to control the opening degrees of the valves, a parameter adjustment to optimize the supply flow rate or the discharge flow rate may be complicated. According to this aspect, the value of the opening degree of the valve can be set for each of sections of the oxygen concentration, and therefore it is possible to easily adjust the supply flow rate or the discharge flow rate.

BRIEF DESCRIPTION OF DRAWINGS

FIG. 7 is a diagram showing a correspondence table of an oxygen concentration, a nitrogen supply flow rate and an opening degree of a discharge valve.

DETAILED DESCRIPTION

Figure 1:
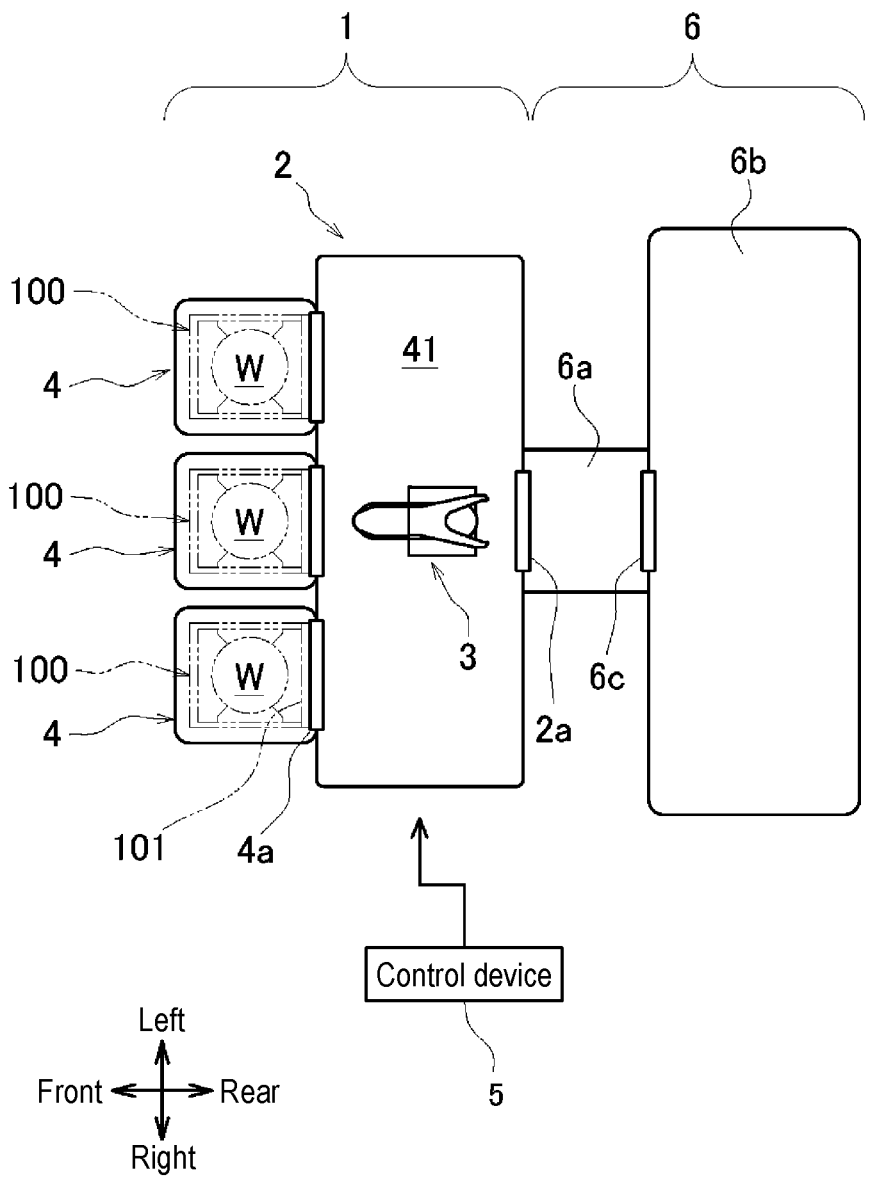
FIG. 1 is a schematic plan view of an EFEM according to the present embodiment and surroundings thereof.

Next, an embodiment of the present disclosure will be described with reference to FIGS. 1 to 9D. For the convenience of explanation, directions shown in FIG. 1 are defined as front, rear, left and right directions. That is, the direction in which an EFEM (Equipment Front End Module) 1 and a substrate processing apparatus 6 are arranged side by side is defined as a front-rear direction. The side of the EFEM 1 is defined as a front side, and the side of the substrate processing apparatus 6 is defined as a rear side. The direction in which a plurality of load ports 4 is arranged side by side and which is orthogonal to the front-rear direction, is defined as a left-right direction. In addition, the direction orthogonal to both the front-rear direction and the left-right direction is defined as an up-down direction.

(Schematic Configuration of EFEM and Surroundings Thereof)

Figure 2:
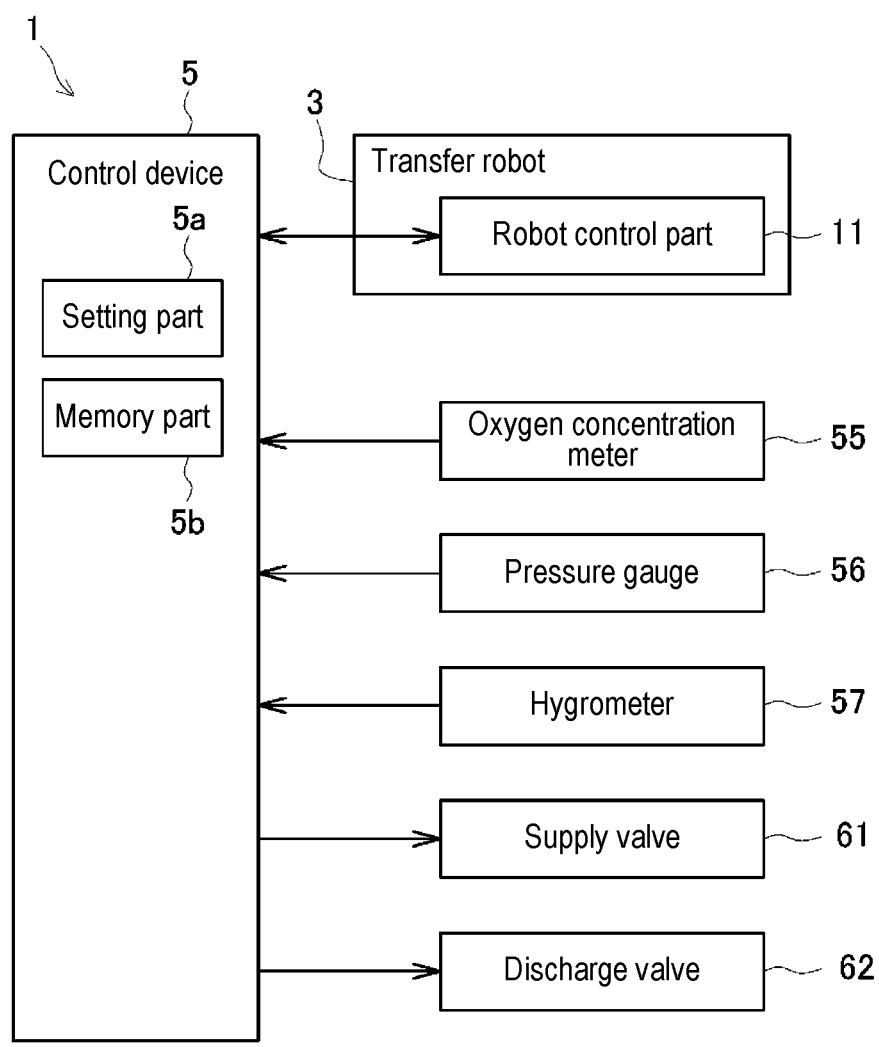
FIG. 2 is a diagram showing an electrical configuration of the EFEM.

First, the schematic configuration of the EFEM 1 and surroundings thereof will be described with reference to FIGS. 1 and 2. FIG. 1 is a schematic plan view of the EFEM 1 according to the present embodiment and the surroundings thereof. FIG. 2 is a diagram showing the electrical configuration of the EFEM 1. As shown in FIG. 1, the EFEM 1 includes a housing 2, a transfer robot 3, a plurality of load ports 4, and a control device 5 (control part of the present disclosure). A substrate processing apparatus 6 that performs a predetermined process on a wafer W is arranged behind the EFEM 1. The EFEM 1 delivers a wafer W between an FOUP (Front-Opening Unified Pod) 100 mounted on the load port 4 and the substrate processing apparatus 6 by using the transfer robot 3 arranged in the housing 2. The FOUP 100 is a container capable of accommodating a plurality of wafers W side by side in the up-down direction, and has a lid 101 attached to a rear end portion thereof (an end portion on the side of the housing 2 in the front-rear direction). The FOUP 100 is transferred by, for example, an OHT (an overhead-traveling unmanned transfer vehicle) (not shown) that travels while being suspended by a rail (not shown) provided above the load port 4. The FOUP 100 is delivered between the OHT and the load port 4.

The housing 2 is used to connect the plurality of load ports 4 and the substrate processing apparatus 6. Inside the housing 2, there is formed a transfer chamber 41 which is substantially sealed from the external space and in which the wafer W is transferred. When the EFEM 1 is operating, the transfer chamber 41 is filled with nitrogen (an inert gas in the present disclosure). The housing 2 is configured so that nitrogen circulates through an internal space including the transfer chamber 41 (details will be described below). Furthermore, a door 2a is attached to the rear end of the housing 2. The transfer chamber 41 is connected to the substrate processing apparatus 6 with the door 2a interposed therebetween.

The transfer robot 3 is arranged in the transfer chamber 41 and transfers the wafer W. The transfer robot 3 includes a base part 3a (see FIG. 3) whose position is fixed, an arm mechanism 3b (see FIG. 3) arranged above the base part 3a to hold and transfer the wafer W, and a robot control part 11 (see FIG. 2). The transfer robot 3 mainly performs an operation of taking out the wafer W from the FOUP 100 and delivering it to the substrate processing apparatus 6, and an operation of receiving the wafer W processed by the substrate processing apparatus 6 and returning it to the FOUP 100.

Figure 5:
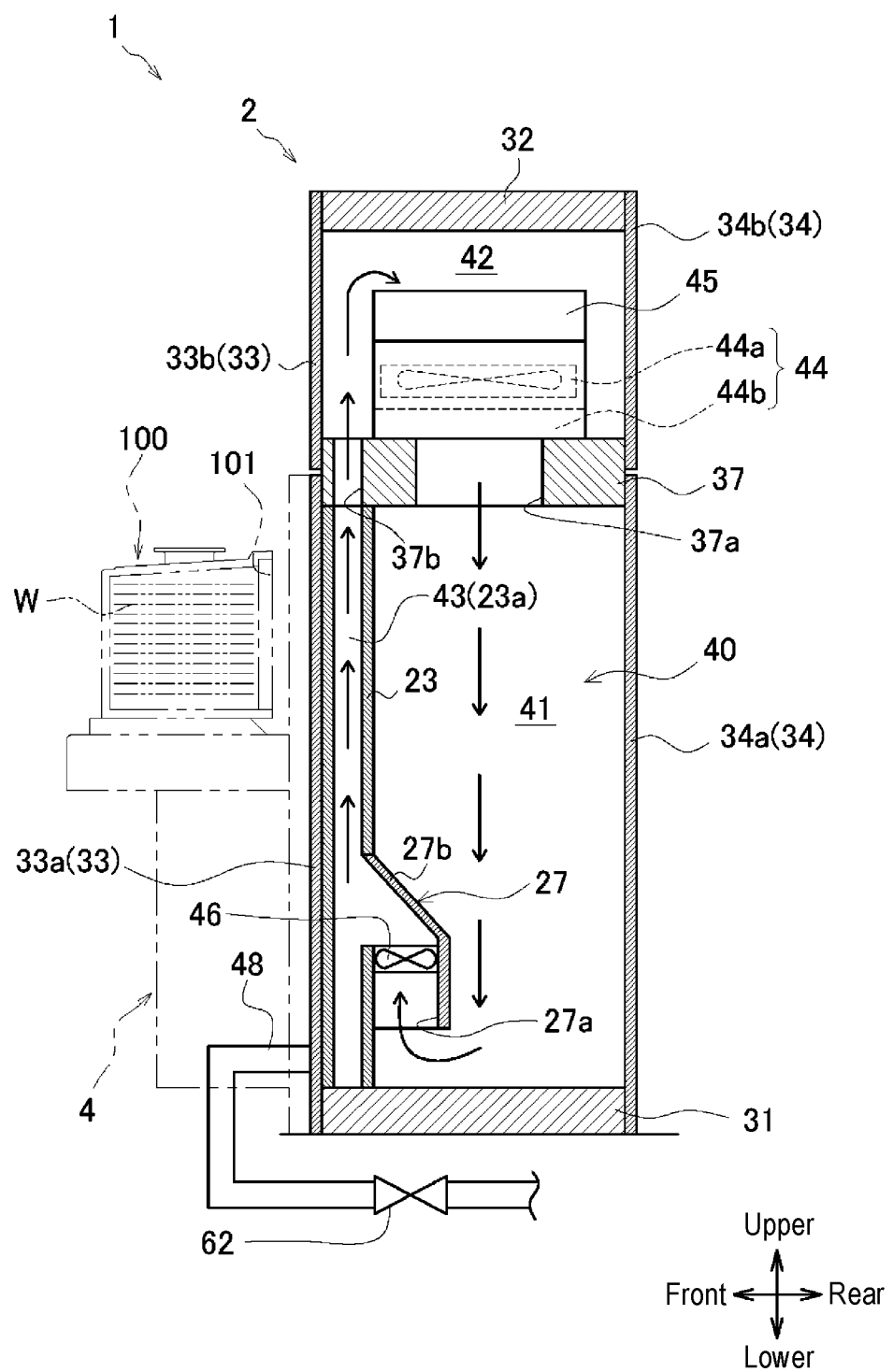
FIG. 5 is a cross-sectional view taken along V-V in FIG. 3.

The load port 4 is used to mount the FOUP 100 (see FIG. 5). The plurality of load ports 4 is arranged side by side in the left-right direction so that the rear end portions thereof extend along partition walls on the front side of the housing 2. The load port 4 is configured to be able to replace the atmosphere inside the FOUP 100 with an inert gas such as nitrogen or the like. A door 4a is provided at the rear end of the load port 4. The door 4a is opened and closed by a door opening/closing mechanism (not shown). The door 4a is configured to be able to unlock the lid 101 of the FOUP 100 and hold the lid 101. The lid 101 is opened, as a door movement mechanism opens the door 4a in a state that the door 4a holds the unlocked lid 101. As a result, the wafer W in the FOUP 100 can be taken out by the transfer robot 3.

As shown in FIG. 2, the control device 5 includes a setting part 5a to set various parameters and the like, and a memory part 5b that stores the set parameters and the like (details will be described below). The control device 5 is electrically connected to a robot control part 11 of the transfer robot 3, a control part (not shown) of the load port 4 and a control part (not shown) of the substrate processing apparatus 6 so as to make communication with these control parts. The control device 5 is electrically connected to an oxygen concentration meter 55 (a concentration detection part in the present disclosure), a pressure gauge 56 (a pressure detection part in the present disclosure), a hygrometer 57 and the like, which are installed inside the housing 2, and receives measurement results of these measurement instruments to grasp the information regarding an atmosphere inside the housing 2. The control device 5 is electrically connected to a supply valve 61 and a discharge valve 62 (described below), and adjusts opening degrees of these valves to appropriately adjust the atmosphere inside the housing 2.

As shown in FIG. 1, the substrate processing apparatus 6 includes, for example, a load lock chamber 6a and a processing chamber 6b. The load lock chamber 6a is a chamber connected to the transfer chamber 41 with the door 2a of the housing 2 interposed therebetween and configured to temporarily hold the wafer W. The processing chamber 6b is connected to the load lock chamber 6a with a door 6c interposed therebetween. In the processing chamber 6b, a predetermined process is performed on the wafer W by a processing mechanism (not shown).

(Housing and Internal Configuration Thereof)

Figure 3:
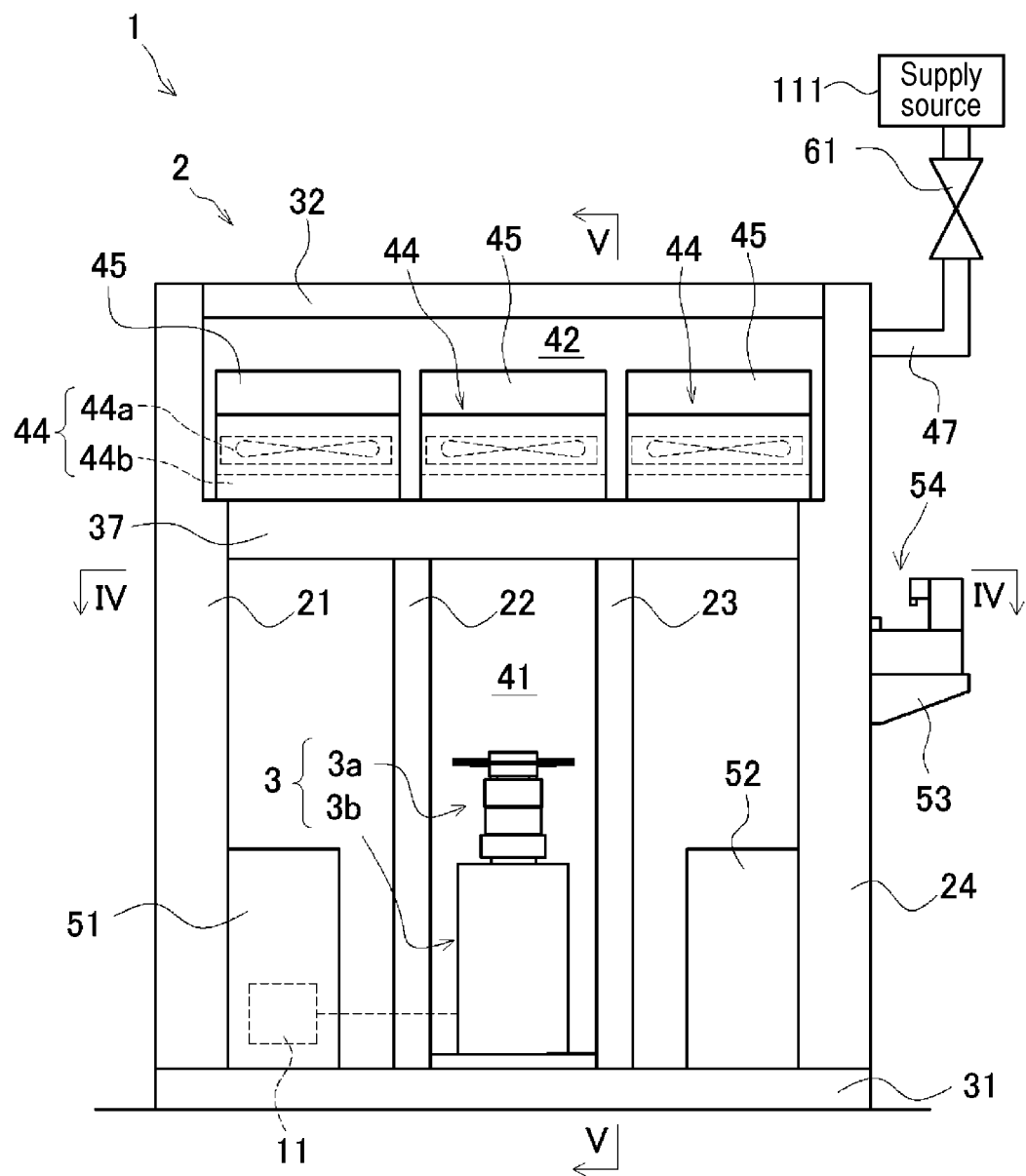
FIG. 3 is a front view of a housing.
Figure 4:
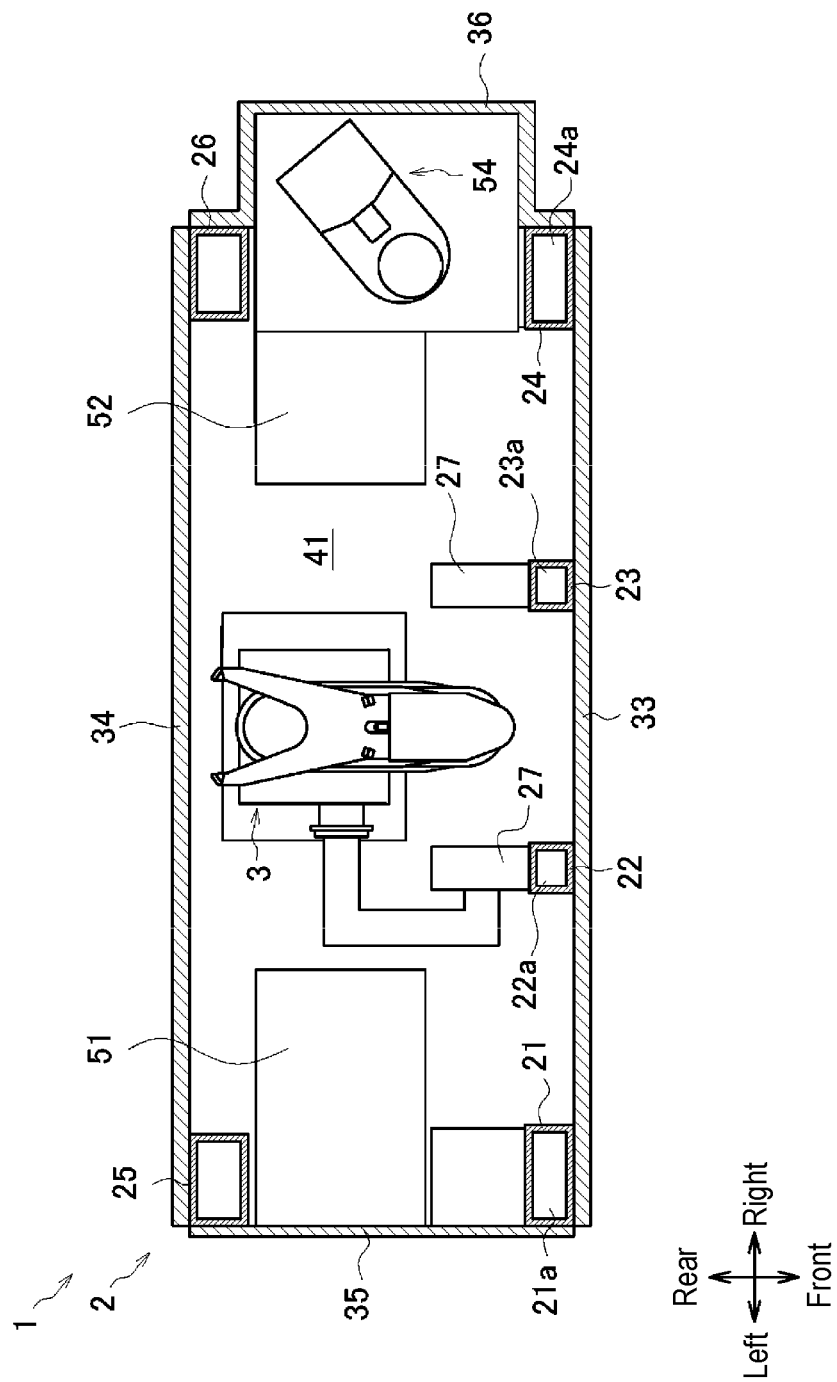
FIG. 4 is a cross-sectional view taken along IV-IV in FIG. 3.

Next, the housing 2 and an internal structure thereof will be described with reference to FIGS. 3 to 5. FIG. 3 is a front view of the housing 2. FIG. 4 is a cross-sectional view taken along IV-IV in FIG. 3. FIG. 5 is a cross-sectional view taken along V-V in FIG. 3. In FIG. 3, illustration of the partition wall is omitted. In FIG. 5, illustration of the transfer robot 3 and the like is omitted.

The housing 2 has a rectangular parallelepiped shape as a whole. As shown in FIGS. 3 to 5, the housing 2 includes columns 21 to 26 and partition walls 31 to 36. The partition walls 31 to 36 are attached to the columns 21 to 26 extending in the up-down direction, and an internal space of the housing 2 is substantially sealed from the external space.

More specifically, as shown in FIG. 4, at the front end portion of the housing 2, the columns 21 to 24 are sequentially arranged upright from the left side to the right side. The columns 22 and 23 arranged between the columns 21 and 24 are shorter than the columns 21 and 24. The columns 25 and 26 are arranged upright on the left and right sides of the rear end portion of the housing 2.

As shown in FIG. 3, a partition wall 31 is arranged at a bottom of the housing 2, and a partition wall 32 is arranged at a ceiling of the housing 2. As shown in FIG. 4, the partition wall 33 is arranged at the front end portion, the partition wall 34 is arranged at the rear end portion, the partition wall 35 is arranged at the left end portion, and the partition wall 36 is arranged at the right end portion, respectively. A mounting part 53 (see FIG. 3) on which an aligner 54 described below is mounted is provided at the right end portion of the housing 2. The aligner 54 and the mounting part 53 are also accommodated inside the housing 2 (see FIG. 4).

As shown in FIGS. 3 and 5, a support plate 37 that extends in the horizontal direction is arranged in an upper portion (above the columns 22 and 23) inside the housing 2. Thus, the inside of the housing 2 is divided into the above-described transfer chamber 41 formed on the lower side and an FFU installation chamber 42 formed on the upper side. An FFU (fan filter unit) 44 described below is arranged in the FFU installation chamber 42. An opening 37a that brings the transfer chamber 41 and the FFU installation chamber 42 into communication with each other is formed at a center of the support plate 37 in the front-rear direction. The partition walls 33 to 36 of the housing 2 are divided into lower partition walls for the transfer chamber 41 and upper partition walls for the FFU installation chamber 42 (see, for example, partition walls 33a and 33b at the front end portion and partition walls 34a and 34b at the rear end portion in FIG. 5).

Next, the internal configuration of the housing 2 will be described. Specifically, the configuration to circulate nitrogen in the housing 2 and surrounding configuration thereof, and devices and the like arranged in the transfer chamber 41 will be described.

The configuration to circulate nitrogen in the housing 2 and the surrounding configuration thereof will be described with reference to FIGS. 3 to 5. As shown in FIG. 5, a circulation path 40 to circulate nitrogen is formed inside the housing 2. The circulation path 40 is defined by the transfer chamber 41, the FFU installation chamber 42 and a return path 43. As an overview, in the circulation path 40, clean nitrogen is sent downward from the FFU installation chamber 42. After reaching a lower end of the transfer chamber 41, nitrogen rises through the return path 43 and returns to the FFU installation chamber 42 (see arrows in FIG. 5). The details will be described below.

An FFU 44 arranged on the support plate 37 and a chemical filter 45 arranged on the FFU 44 are provided at the FFU installation chamber 42. The FFU 44 includes a fan 44a and a filter 44b. The FFU 44 sends nitrogen in the FFU installation chamber 42 downward by the fan 44a, and removes particles (not shown) contained in the nitrogen by the filter 44b. The chemical filter 45 is configured to remove, for example, active gas and the like brought into the circulation path 40 from the substrate processing apparatus 6. The nitrogen cleaned by the FFU 44 and the chemical filter 45 is sent from the FFU installation chamber 42 to the transfer chamber 41 through openings 37a formed in the support plate 37. The nitrogen sent to the transfer chamber 41 forms a laminar flow and flows downward.

The return path 43 is formed in the columns 21 to 24 (column 23 in FIG. 5) arranged at the front end portion of the housing 2 and the support plate 37. That is, the columns 21 to 24 are hollow, and spaces 21a to 24a through which nitrogen can pass are formed in the columns 21 to 24 respectively (see FIG. 4). That is, each of the spaces 21a to 24a constitutes the return path 43. The return path 43 is brought into communication with the FFU installation chamber 42 through an opening 37b formed at the front end portion of the support plate 37 (see FIG. 5).

The return path 43 will be described more specifically with reference to FIG. 5. Although the column 23 is shown in FIG. 5, the same applies to other columns 21, 22 and 24. An introduction duct 27 to facilitate a flow of nitrogen in the transfer chamber 41 into the return path 43 (space 23a) is attached to the lower end of the column 23. An opening 27a is formed at the introduction duct 27 so that the nitrogen that has reached the lower end of the transfer chamber 41 can flow into the return path 43. On the upper portion of the introduction duct 27, there is formed an enlarged portion 27b which spreads backward as it goes downward. A fan 46 is disposed below the enlarged portion 27b. The fan 46 is driven by a motor (not shown). The fan 46 sucks the nitrogen that has reached the lower end of the transfer chamber 41 into the return path 43 (the space 23a in FIG. 5) and sends the nitrogen upward to return the nitrogen to the FFU installation chamber 42. The nitrogen returned to the FFU installation chamber 42 is cleaned by the FFU 44 and the chemical filter 45, and is sent again to the transfer chamber 41. As described above, the nitrogen can be circulated in the circulation path 40.

Furthermore, as shown in FIG. 3, a supply pipe 47 to supply nitrogen into the circulation path 40 is connected to a side portion of the FFU installation chamber 42. The supply pipe 47 is connected to a nitrogen supply source 111. A supply valve 61 capable of changing the supply amount of nitrogen per unit time is provided in the middle of the supply pipe 47. Furthermore, as shown in FIG. 5, a discharge pipe 48 to discharge the gas in the circulation path 40 is connected to the front end portion of the transfer chamber 41. The discharge pipe 48 is connected to, for example, an exhaust port (not shown). A discharge valve 62 capable of changing the discharge amount of the gas in the circulation path 40 per unit time is installed in the middle of the discharge pipe 48. The supply valve 61 and the discharge valve 62 are electrically connected to the control device 5 (see FIG. 2). This makes it possible to appropriately supply and discharge nitrogen to and from the circulation path 40. For example, when the oxygen concentration in the circulation path 40 increases, the oxygen concentration can be lowered by temporarily supplying a large amount of nitrogen from the supply source 111 to the circulation path 40 via the supply pipe 47 and discharging oxygen together with nitrogen via the discharge pipe 48. Details will be described below.

Next, the devices and the like disposed in the transfer chamber 41 will be described with reference to FIGS. 3 and 4. As shown in FIGS. 3 and 4, in the transfer chamber 41, the above-described transfer robot 3, a control part accommodating box 51, a measurement instrument accommodating box 52, and an aligner 54 are disposed. The control part accommodating box 51 is installed, for example, on the left side of the base part 3a of the transfer robot 3 (see FIG. 3) and is arranged so as not to interfere with the arm mechanism 3b (see FIG. 3). The robot control part 11 described above is stored in the control part accommodating box 51. The measurement instrument accommodating box 52 is installed, for example, on the right side of the base part 3a, and is disposed so as not to interfere with the arm mechanism 3b. The measurement instrument accommodating box 52 can accommodate the measurement instruments such as the oxygen concentration meter 55, the pressure gauge 56, the hygrometer 57 and the like described above (see FIG. 2).

The aligner 54 is used to detect how much the holding position of the wafer W held by the arm mechanism 3b of the transfer robot 3 (see FIG. 3) deviates from a target holding position. For example, the wafer W may be slightly moved inside the FOUP 100 (see FIG. 1) transferred by the OHT (not shown) described above. Therefore, the transfer robot 3 once places the unprocessed wafer W, which is taken out of the FOUP 100, on the aligner 54. The aligner 54 measures how far the wafer W held by the transfer robot 3 is deviated from the target holding position, and sends the measurement result to the robot control part 11. The robot control part 11 corrects the holding position in the arm mechanism 3b based on the above measurement result, controls the arm mechanism 3b to hold the wafer W at the target holding position, and causes the arm mechanism 3b to transfer the wafer W to the load lock chamber 6a of the substrate processing apparatus 6. As a result, the wafer W can be normally processed by the substrate processing apparatus 6.

(Regarding Pressure Control)

Figure 6A:
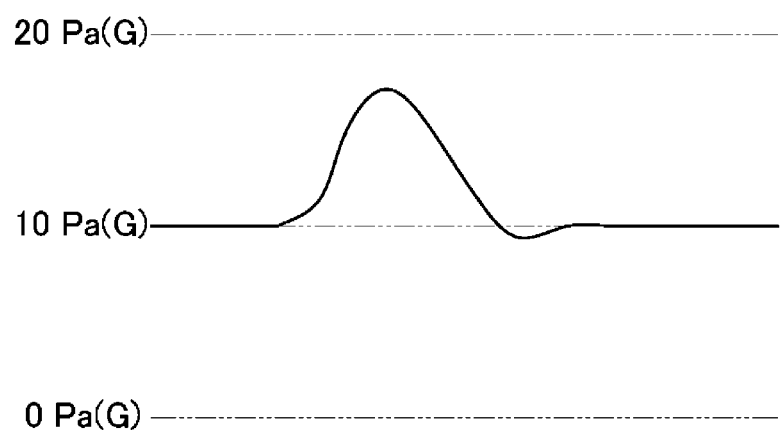
FIGS. 6A and 6B are diagrams showing a feed-back control of a pressure in a circulation path.
Figure 6B:
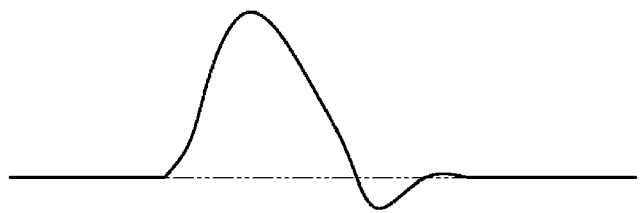

Next, the feed-back control of the pressure in the circulation path 40 by the control device 5 will be briefly described with reference to FIGS. 6A and 6B. FIG. 6A is a diagram showing a time-dependent change of the pressure in the circulation path 40. FIG. 6B is a diagram showing a time-dependent change of the opening degree of the discharge valve 62.

The control device 5 is configured to be capable of performing feed-back control of the opening degree of the discharge valve 62 based on the detection result of the pressure gauge 56 (see FIG. 2) so that the pressure inside the circulation path 40 is maintained at a target pressure. The target pressure is, for example, a pressure (10 Pa (G)) higher than the pressure outside the housing 2 (atmospheric pressure) by 10 Pa. That is, the pressure inside the circulation path 40 may preferably be slightly higher than an external pressure to reliably suppress invasion of the ambient air into the circulation path 40 from the outside while suppressing the leakage of nitrogen from the circulation path 40 to the outside. As an example, the pressure inside the circulation path 40 is in the range of 3 to 500 Pa (G), and preferably in the range of 5 to 100 Pa (G).

For example, when the pressure in the circulation path 40 becomes higher than 10 Pa (G) as shown in FIG. 6A, the control device 5 increases the opening degree of the discharge valve 62 as shown in FIG. 6B to increase the discharge flow rate of the gas in the circulation path 40, thereby bringing the pressure in the circulation path 40 close to 10 Pa (G). On the contrary, when the pressure in the circulation path 40 becomes lower than 10 Pa (G), the control device 5 reduces the opening degree of the discharge valve 62 to reduce the discharge flow rate of the gas in the circulation path 40. The specific control method is preferably, but is not limited to, the generally-known PID control (control to perform a proportional control, an integral control and a derivative control).

(Regarding Oxygen Concentration Control)

Next, the control of the oxygen concentration in the circulation path 40 will be briefly described. When the oxygen concentration in the circulation path 40 increases for a certain reason, it is required to quickly reduce the oxygen concentration in order to suppress the influence of oxygen on the wafer W. For example, the oxygen concentration in the circulation path 40 is controlled to become less than 100 ppm, preferably less than 70 ppm, and more preferably less than 30 ppm. When it is determined based on the detection result of the oxygen concentration meter 55 that the oxygen concentration in the circulation path 40 has increased, the control device 5 controls the supply valve 61 to increase the opening degree of the supply valve 61, thereby increasing the supply flow rate of nitrogen. As a result, the oxygen concentration in the circulation path 40 is lowered by actively replacing the gas in the circulation path 40. Conversely, when the oxygen concentration is reduced to some extent, the control device 5 controls the supply valve 61 to reduce the supply flow rate of nitrogen. This suppresses an increase in running cost.

In a configuration in which the control device 5 controls the supply valve 61 to change the supply flow rate of nitrogen, and then changes the opening degree of the discharge valve 62 after waiting for a change in the pressure in the circulation path 40 (that is, a configuration in which the feed-back control of the opening degree of the discharge valve 62 is performed), the following problems may occur. That is, it may take some time until the change in the pressure in the circulation path 40 is detected by the pressure gauge 56 after the supply flow rate of nitrogen is changed. Therefore, the timing of changing the discharge flow rate with respect to the change of the supply flow rate may be delayed (that is, the timing of pressure control may be delayed) and the fluctuation of the pressure in the circulation path 40 may increase. As a result, there may occur a problem that the pressure in the circulation path 40 becomes too higher than the external pressure, whereby nitrogen easily leaks from the circulation path 40 to the outside, or a problem that the pressure in the circulation path 40 becomes too lower than the external pressure, whereby the ambient air easily flows into the circulation path 40 from the outside. Even when a negative pressure is generated locally, there is a possibility that the ambient air may flow into the circulation path 40 and the oxygen concentration may increase. Therefore, the control device 5 according to the present embodiment has the following configuration in order to suppress the fluctuation of the pressure in the circulation path 40.

(Details of Control Device)

Details of the control device 5 will be described. First, the control device 5 is configured to be capable of switching the control mode of the discharge valve 62 between two modes. The first control mode is a feed-back mode in which, as described above, the opening degree of the discharge valve 62 is feed-back-controlled based on the detection result of the pressure gauge 56. The second control mode is a feed-forward mode in which the opening degree of the discharge valve 62 is changed together with change in the opening degree of the supply valve 61 (that is, feed-forward control is performed) based on the detection result of the oxygen concentration meter 55. Is.

Information used for the feed-forward control will be described with reference to FIG. 7. As described above, the control device 5 includes the memory part 5b (see FIG. 2). As shown in FIG. 7, the memory part 5b stores in advance a correspondence table in which the oxygen concentration in the circulation path 40, the nitrogen supply flow rate to the circulation path 40, and the opening degree of the discharge valve 62 are associated with each other. The correspondence table is divided into a plurality of sections according to the range of the oxygen concentration (in other words, according to the change of the atmosphere in the circulation path 40). In the present embodiment, the correspondence table is divided into five categories (200 ppm or more, 100 to 199 ppm, 70 to 99 ppm, 30 to 69 ppm, and 29 ppm or less sequentially from the top of the sheet surface in FIG. 7). The nitrogen supply flow rate (which is changed depending on the opening degree of the supply valve 61) and the opening degree of the discharge valve 62 are associated with each other in each of these sections. The correspondence table is stored in the memory part 5b in advance. However, the numerical values of the correspondence table may be changed by operating the setting part 5a (see FIG. 2). When the control mode is the feed-forward mode, the control device 5 determines the nitrogen supply flow rate and the opening degree of the discharge valve 62 by referring to the correspondence table. Thus, when the oxygen concentration in the circulation path 40 fluctuates, it is possible to change the opening degree of the supply valve 61 and the opening degree of the discharge valve 62 at the same time.

(Details of Oxygen Concentration Control)

Figure 8:
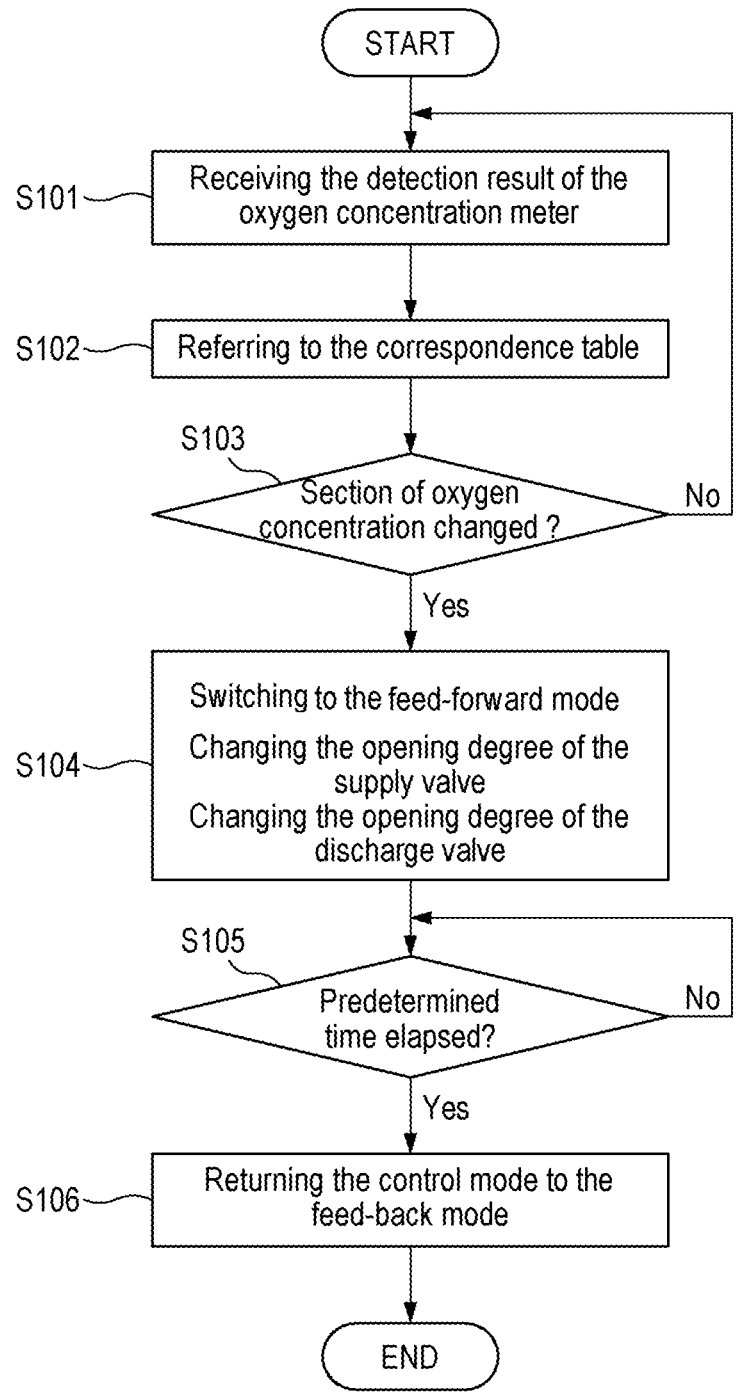
FIG. 8 is a flowchart showing a control of an oxygen concentration in the circulation path.
Figure 9A:
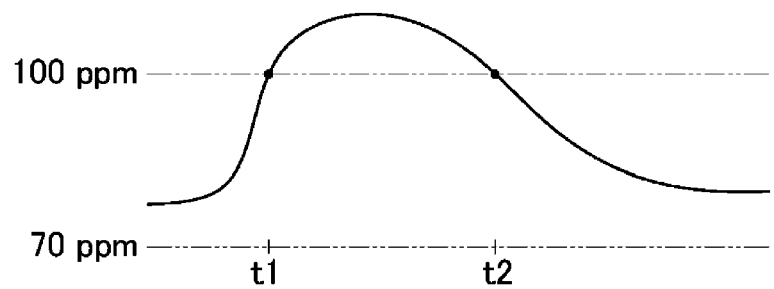
FIGS. 9A to 9D are diagrams showing time-dependent changes of an oxygen concentration, a nitrogen supply flow rate and an opening degree of a discharge valve.
Figure 9B:
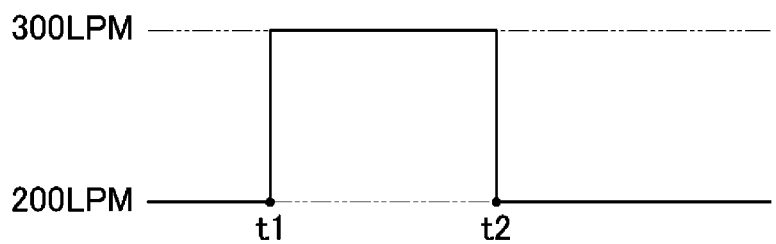
Figure 9C:
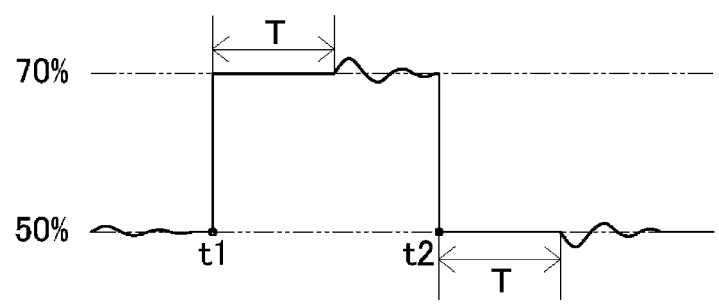
Figure 9D:
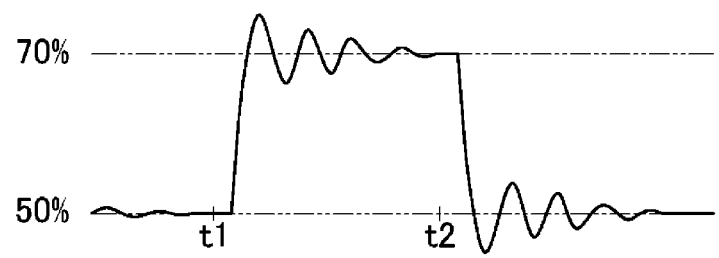

Next, details of the oxygen concentration control performed by the control device 5 will be described with reference to FIGS. 7 to 9. FIG. 8 is a flow chart showing the control of the oxygen concentration in the circulation path 40. FIG. 9A is a diagram showing a time-dependent change of the oxygen concentration in the circulation path 40. FIG. 9B is a diagram showing a time-dependent change of the nitrogen supply flow rate to the circulation path 40. FIG. 9C is a diagram showing a time-dependent change of the opening degree of the discharge valve 62. FIG. 9D is a diagram showing a time-dependent change of the opening degree of the discharge valve 62 in the conventional method (when only the feed-back control is performed). The horizontal axis in each of FIGS. 9A to 9D represents the time.

In the initial state, for example, the oxygen concentration is within the range of 70 to 99 ppm (the section in the center of the correspondence table shown in FIG. 7), and the nitrogen supply flow rate is 200 LPM (liters per minute). Further, the control mode of the discharge valve 62 is the feed-back mode, and the opening degree of the discharge valve 62 is finely adjusted to about 50%.

As shown in FIG. 8, first, the control device 5 receives the detection result of the oxygen concentration meter 55 (S101), and refers to the correspondence table (S102). The control device 5 determines whether or not the section of the oxygen concentration in the circulation path 40 has been changed (specifically, whether or not the oxygen concentration is out of the range of 70 to 99 ppm) based on the detection result of the oxygen concentration meter 55 and the correspondence table. (S103). In a case where the section of the oxygen concentration is not changed (in other words, in a case where a change in the atmosphere in the circulation path 40 is small), the process returns to step S101. In a case where the oxygen concentration is changed, for example, in a case where the oxygen concentration is 100 ppm or more at time t1 as shown in FIG. 9A, the control device 5 changes the opening degree of the supply valve 61 to change the nitrogen supply flow rate. Specifically, the control device 5 changes the nitrogen supply flow rate to a value (300 LPM) associated with the section having an oxygen concentration of 100 to 199 ppm (the second section from a top of a sheet surface in FIG. 7). At the same time, the control device 5 switches the control mode of the discharge valve 62 from the feed-back mode to the feed-forward mode. Then, the control device 5 determines the opening degree of the discharge valve 62 to a predetermined value (here, the value (70%) associated with the section having the oxygen concentration of 100 to 199 ppm), and changes the opening degree of the discharge valve 62 (S104). As a result, the nitrogen supply flow rate to the circulation path 40 and the gas discharge flow rate from the circulation path 40 are simultaneously changed.

After step S104, the control device 5 maintains the control mode of the discharge valve 62 in the feed-forward mode until a predetermined time T (see FIG. 9C) elapses (S105). The predetermined time T is the time which is taken until the gas flow rate of each part (the transfer chamber 41, the return path 43, the FFU chamber 42 or the like) that constitutes the circulation path 40 is stabilized to some extent (until the pressure distribution in the circulation path 40 is made uniform to some extent) after the supply flow rate and the discharge flow rate are changed. The length of the predetermined time T is preferably, for example, 3 to 5 seconds. The predetermined time T may be determined based on a conductance according to a shape or volume of a flow path (circulation path 40 or the like) of the apparatus, or may be determined by performing fluid analysis through the use of simulation software. The control device 5 returns the control mode of the discharge valve 62 from the feed-forward mode to the feed-back mode when the predetermined time T has elapsed (S106). As a result, the feed-back control of the discharge valve 62 is restarted.

A specific example of the series of control described above will be described with reference to FIG. 9. At time t1, when the oxygen concentration becomes 100 ppm or more (see FIG. 9A), the control device 5 changes the nitrogen supply flow rate from 200 LPM to 300 LPM based on the correspondence table (see FIG. 9B). At the same time, the control device 5 switches the control mode to the feed-forward mode, changes the opening degree of the discharge valve 62 to 70%, and maintains the opening degree of the discharge valve 62 at 70% until the predetermined time T elapses (see FIG. 9C). When the predetermined time T has elapsed after the control mode was switched to the feed-forward mode, the control device 5 returns the control mode to the feed-back mode.

At time t2, when the oxygen concentration falls below 100 ppm (see FIG. 9A), the control device 5 returns the nitrogen supply flow rate from 300 LPM to 200 LPM (see FIG. 9B). At the same time, the control device 5 switches the control mode of the discharge valve 62 to the feed-forward mode and changes the opening degree of the discharge valve 62 to 50% (see FIG. 9C). When the predetermined time T has elapsed after the control mode has been switched, the control device 5 returns the control mode to the feed-back mode. The aforementioned control is repeatedly performed by the control device 5.

Referring to FIGS. 9C and 9D, the time-dependent change of the opening degree of the discharge valve 62 according to the present embodiment and the time-dependent change of the opening degree of the discharge valve 62 in the conventional method (the method in which only the feed-back control is performed on the discharge valve 62) are compared with each other. In the conventional method, for example, when the nitrogen supply flow rate is changed at time t1, the opening degree of the discharge valve 62 is not changed significantly until a change in pressure is detected by the pressure gauge 56, and the opening degree of the discharge valve 62 is changed rapidly after the change in pressure is detected (see FIG. 9D). This may cause a problem that the pressure fluctuation in the circulation path 40 increases. On the other hand, in the present embodiment, there is performed feed-forward control in which the opening degree of the discharge valve 62 is changed together with the change in the opening degree of the supply valve 61 (see FIG. 9C). As a result, fluctuation in the opening degree of the discharge valve 62 is suppressed and fluctuation in the pressure in the circulation path 40 is suppressed, as compared with the case where the discharge flow rate is changed after waiting for the detection of the pressure change in the circulation path 40.

In the present embodiment, the control device 5 controls the discharge valve 62, but the present disclosure is not limited thereto. For example, a discharge control part (not shown) that controls the discharge valve 62 may be electrically interposed between the control device 5 and the discharge valve 62. In such a configuration, the discharge control part may perform feed-back control of the opening degree of the discharge valve 62 during the normal time, and may perform feed-forward control in response to an instruction from the control device 5. That is, the discharge control part may switch the control mode between the feed-back mode and the feed-forward mode. Furthermore, the control device 5 may transmit a signal instructing the switching of the control mode to the discharge control part based on the detection result of the oxygen concentration meter 55. In this configuration, the control device 5 and the discharge control part work together to function as the control part of the present disclosure.

As described above, the opening degree of the discharge valve 62 is determined to a predetermined value according to the change of the atmosphere in the circulation path 40. Thus, the opening degree of the discharge valve 62 can be changed together with the change in the opening degree of the supply valve 61. In other words, by increasing the discharge flow rate in conformity with the timing of increasing the supply flow rate and decreasing the discharge flow rate in conformity with the timing of decreasing the supply flow rate, it is possible to reduce the pressure fluctuation in the circulation path 40 as compared with the case of changing the discharge flow rate after waiting for the pressure change in the circulation path 40. Accordingly, it is possible to suppress the pressure fluctuation in the circulation path 40 when the supply flow rate of the inert gas is changed.

Furthermore, by appropriately switching the control mode between the feed-back mode and the feed-forward mode, it is possible to reliably and stably control the pressure in the circulation path 40 during the normal time, and to effectively suppress the pressure fluctuation in the circulation path 40 when the nitrogen supply flow rate is changed.

Furthermore, when the predetermined time T has elapsed after the control mode was switched to the feed-forward mode and when the gas flow rate of each part (the transfer chamber 41, the return path 43, the FFU chamber 42 or the like) constituting the circulation path 40 has been stabilized to some extent, the control mode is returned to the feed-back mode. Accordingly, it is possible to stabilize the feed-back control of the pressure after the nitrogen supply flow rate is changed.

Furthermore, the correspondence table is stored in the memory part 5*b*, and the values of the opening degrees of the supply valve 61 and the discharge valve 62 can be set for each oxygen concentration section. Therefore, it is possible to easily adjust the supply flow rate and the discharge flow rate.

Next, modifications of the above-described embodiment will be described. The components having the same configurations as those of the above-described embodiments are designated by like reference numerals, and the description thereof will be appropriately omitted.

(1) In the above-described embodiments, the control device 5 changes the opening degree of the discharge valve 62 together with the change in the opening degree of the supply valve 61. However, the present disclosure is not limited thereto. The timing of changing the opening degree of the supply valve 61 and the timing of changing the opening degree of the discharge valve 62 may be shifted within a range in which the effects of the present disclosure can be obtained.

(2) In the embodiments described above, the control mode is returned to the feed-back mode when the predetermined time T has elapsed after the control mode was switched to the feed-forward mode, but the present disclosure is not limited thereto. That is, the control device 5 may return the control mode to the feed-back mode immediately after the opening degrees of the supply valve 61 and the discharge valve 62 are changed by switching the control mode to the feed-forward mode.

(3) In the above-described embodiments, the number of sections of the correspondence table stored in the memory part 5b is five, but the number of sections is not limited thereto. The number of sections may be any number as long as it is plural. Alternatively, instead of the correspondence table, for example, a function in which the oxygen concentration is associated with the opening degree of the supply valve 61 and a function in which the oxygen concentration is associated with the opening degree of the discharge valve 62 may be stored in the memory part 5b.

(4) In the above-described embodiments, nitrogen is used as the inert gas, but the present disclosure is not limited thereto. For example, argon or the like may be used as the inert gas.

(5) In the above-described embodiments, the gas supply and the gas exhaust are controlled by detecting the change in the oxygen concentration, but the present disclosure is not limited thereto. For example, the control device 5 may determine the opening degree of the discharge valve 62 to a predetermined value by detecting the change in the humidity (moisture concentration) in the circulation path 40 with the hygrometer 57 (see FIG. 2). Accordingly, it is possible to suppress the pressure fluctuation in the circulation path 40 when the supply flow rate of nitrogen (dry nitrogen) is changed according to the change of the water concentration. Alternatively, the control may be performed by detecting both the oxygen concentration and the humidity. In addition, the control may be performed by detecting other changes in the atmosphere.

EXPLANATION OF REFERENCE NUMERALS

1: EFEM, 5: control device (control part), 5b: memory part, 40: circulation path, 55: oxygen concentration meter (concentration detection part), 56: pressure gauge (pressure detection part), 61: supply valve, 62: discharge valve, T: predetermined time

What is claimed is:
1. An EFEM comprising:
a circulation path that circulates an inert gas, including:
   a transfer chamber including a transfer robot;
   a fan filter unit installation chamber including a fan filter unit that is arranged so as to form a laminar flow of the inert gas, and configured to clean the inert gas and transfer the cleaned inert gas; and
   a return path arranged to return the inert gas in the transfer chamber to the fan filter unit installation chamber,
a supply valve configured to be capable of changing a supply flow rate of the inert gas supplied to the circulation path;
a discharge valve configured to be capable of changing a discharge flow rate of a gas discharged from the circulation path;
a concentration detection part configured to detect a change in an atmosphere inside the circulation path;
a pressure detection part configured to detect a pressure in the circulation path; and
a control part configured to control the supply valve and the discharge valve,
wherein the control part is configured to:
   control an opening degree of the discharge valve so that the pressure in the circulation path is maintained higher than an atmospheric pressure; and
   determine the opening degree of the discharge valve to a predetermined value based on a detection result of the concentration detection part.

2. The EFEM of claim 1, wherein the control part is configured to switch a control mode between a feed-back mode in which the opening degree of the discharge valve is feed-back-controlled based on a detection result of the pressure detection part so that the pressure in the circulation path is maintained at a target pressure and a feed-forward mode in which the opening degree of the discharge valve is determined based on the detection result of the concentration detection part, and
when an opening degree of the supply valve is changed based on the detection result of the concentration detection part, the control mode is switched from the feed-back mode to the feed-forward mode.

3. The EFEM of claim 2, wherein the control part is configured to return the control mode from the feed-forward mode to the feed-back mode when a predetermined time elapses after the control mode is switched from the feed-back mode to the feed-forward mode.

4. The EFEM of claim 2, wherein the control part includes a memory part that stores a table which is divided into a plurality of sections according to the change in the atmosphere and in which the opening degree of the supply valve and the opening degree of the discharge valve are associated with each other for each of the sections.

5. The EFEM of claim 3, wherein the control part includes a memory part that stores a table which is divided into a plurality of sections according to the change in the atmosphere and in which the opening degree of the supply valve and the opening degree of the discharge valve are associated with each other for each of the sections.

6. An EFEM including a circulation path that circulates an inert gas, comprising:
a supply valve configured to be capable of changing a supply flow rate of the inert gas supplied to the circulation path;
a discharge valve configured to be capable of changing a discharge flow rate of a gas discharged from the circulation path;
a concentration detection part configured to detect a change in an atmosphere inside the circulation path;
a pressure detection part configured to detect a pressure in the circulation path; and
a control part configured to control the supply valve and the discharge valve,
wherein the control part is configured to determine an opening degree of the discharge valve to a predetermined value based on a detection result of the concentration detection part,
the control part is configured to switch a control mode between a feed-back mode in which the opening degree of the discharge valve is feed-back-controlled based on a detection result of the pressure detection part so that the pressure in the circulation path is maintained at a target pressure and a feed-forward mode in which the opening degree of the discharge valve is determined based on the detection result of the concentration detection part, and when an opening degree of the supply valve is changed based on the detection result of the concentration detection part, the control mode is switched from the feed-back mode to the feed-forward mode.

7. The EFEM of claim 6, wherein the control part is configured to return the control mode from the feed-forward mode to the feed-back mode when a predetermined time elapses after the control mode is switched from the feed-back mode to the feed-forward mode.

8. The EFEM of claim 6, wherein the control part includes a memory part that stores a table which is divided into a plurality of sections according to the change in the atmosphere and in which the opening degree of the supply valve and the opening degree of the discharge valve are associated with each other for each of the sections.

9. The EFEM of claim 7, wherein the control part includes a memory part that stores a table which is divided into a plurality of sections according to the change in the atmosphere and in which the opening degree of the supply valve and the opening degree of the discharge valve are associated with each other for each of the sections.

* * * * *